(12) United States Patent
Hou et al.

(10) Patent No.: US 11,287,454 B2
(45) Date of Patent: Mar. 29, 2022

(54) CURRENT SAMPLING METHOD AND CURRENT SAMPLING CIRCUIT

(71) Applicant: Contemporary Amperex Technology Co., Limited, Ningde (CN)

(72) Inventors: Yizhen Hou, Ningde (CN); Zhimin Dan, Ningde (CN); Wei Zhang, Ningde (CN); Jinbo Cai, Ningde (CN); Xiong Zheng, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/057,433

(22) PCT Filed: Dec. 4, 2019

(86) PCT No.: PCT/CN2019/123040
§ 371 (c)(1),
(2) Date: Nov. 20, 2020

(87) PCT Pub. No.: WO2020/114426
PCT Pub. Date: Jun. 11, 2020

(65) Prior Publication Data
US 2021/0293860 A1    Sep. 23, 2021

(30) Foreign Application Priority Data

Dec. 4, 2018    (CN) .......................... 201811474923.5

(51) Int. Cl.
*G01R 19/25*    (2006.01)
*G01R 19/00*    (2006.01)
*G01R 19/32*    (2006.01)

(52) U.S. Cl.
CPC ......... *G01R 19/25* (2013.01); *G01R 19/0092* (2013.01); *G01R 19/32* (2013.01)

(58) Field of Classification Search
CPC ..... G01R 19/25; G01R 19/0092; G01R 19/32
See application file for complete search history.

(56) References Cited

U.S. PATENT DOCUMENTS

| 7,605,616 B2 | 10/2009 | Shimbayashi |
| 2007/0007519 A1 | 1/2007 | Durbaum |

(Continued)

FOREIGN PATENT DOCUMENTS

| CN | 102594106 A | 7/2012 |
| CN | 204597507 U | 8/2015 |

(Continued)

OTHER PUBLICATIONS

PCT International Search Report and Written Opinon for PCT/CN2019/123040, dated Feb. 25, 2020, 11 pages.

(Continued)

*Primary Examiner* — Akm Zakaria
(74) *Attorney, Agent, or Firm* — Law Offices of Liaoteng Wang (57) ABSTRACT

The present disclosure discloses a current sampling method and a current sampling circuit. The method comprises: obtaining a detected temperature of each semiconductor switch device of a plurality of parallel semiconductor switch devices; determining that the plurality of parallel semiconductor switch devices are in a current equalization state based on the detected temperature of each semiconductor switch device; obtaining an equalized current flowing through a target semiconductor switch device in the current equalization state, the target semiconductor switch device being any one of the plurality of parallel semiconductor switch devices; determining a total current of a main circuit connected to the plurality of parallel semiconductor switch devices according to the equalized current.

12 Claims, 3 Drawing Sheets

(56) References Cited

U.S. PATENT DOCUMENTS

| | | | | |
|---|---|---|---|---|
| 2013/0063098 A1* | 3/2013 | Knowlton | .................. | H02J 7/00 |
| | | | | 320/137 |
| 2014/0253102 A1* | 9/2014 | Wood | ..................... | G01R 23/02 |
| | | | | 324/140 R |
| 2017/0179944 A1* | 6/2017 | Ngo | ..................... | H03K 17/122 |
| 2017/0197566 A1* | 7/2017 | Nakamura | ............. | G01R 31/54 |
| 2019/0362356 A1 | 11/2019 | Zhang et al. | | |

FOREIGN PATENT DOCUMENTS

| | | |
|---|---|---|
| CN | 204597508 U | 8/2015 |
| CN | 105245188 A | 1/2016 |
| CN | 106953380 A | 7/2017 |
| CN | 106972737 A | 7/2017 |
| CN | 107210739 A | 9/2017 |
| CN | 107976641 A | 5/2018 |
| CN | 108682909 A | 10/2018 |
| CN | 108688499 A | 10/2018 |
| JP | 2002142492 A | 5/2002 |
| JP | 2015035863 A | 2/2015 |
| WO | 2008047416 A1 | 4/2008 |

OTHER PUBLICATIONS

The First Office Action and search report dated Jul. 24, 2020 for Chinese Application No. 201811474923.5, 10 pages.
Hongsheng Hu et al., "The Control Strategy Research on Dynamic Current Balance for the Paralleled IGBT Power Modules", Power Electronics, Vol.52 No. 1, dated Jan. 31, 2018, pp. 61-63.
The extended European search report dated Jul. 1, 2021 for European Application No. 19894192.4, 5 pages.

* cited by examiner

CURRENT SAMPLING METHOD AND CURRENT SAMPLING CIRCUIT

CROSS REFERENCE TO RELATED DISCLOSURES

This disclosure is a National Stage of International Application No. PCT/CN2019/123040, filed on Dec. 4, 2019, which claims priority to Chinese Patent Application No. 201811474923.5, filed on Dec. 4, 2018, both of which are incorporated hereby by reference in their entireties.

FIELD

The present disclosure relates to the field of new energy, and particularly to a current sampling method and a current sampling circuit.

BACKGROUND

In battery management system of a power battery vehicles, relays are widely used as switch protection devices. However, when capacitance of a battery load port is relatively large, a very large peak current will be generated in a circuit where a battery pack and a main relay are located at a moment when the main relay is closed. At present, the main circuit is precharged by adding a precharging circuit before the main relay is closed, so as to reduce an instantaneous current when the main circuit is turned on, thereby reducing failure rate of the main relay and improving the circuit performance.

However, the main relay in the battery management system has disadvantages of slow response time, high power consumption, heavy volume, and high failure rate, and the precharging circuit is composed of a large number of equalization resistors with long precharging time, large occupied area and large thermal power consumption of the equalization resistors. Printed circuit board (PCB) attached with equalization resistors needs special heat dissipation treatment, and a shell of the PCB board attached with equalization resistors needs to reserve space to attach a heat conduction pad so that heat of the equalization resistors may be dissipated through the shell, which increases cost.

Therefore, at present, semiconductor switch devices, such as T metal-oxide semiconductor field-effect transistor (MOS) are used as switch protection devices instead of the main relay. Due to low overcurrent capability of a single MOS transistor, the plurality of MOS transistors are usually connected in parallel to form a switch array to increase overcurrent capability of the main circuit. In order to obtain the current of the main circuit, a Hall sensor or a specially designed current detection circuit is generally used as a current detection module. However, these current detection modules do not detect a current of each single MOS transistor switch channel in the MOS switch array, in this case, equalization for current of each MOS transistor is out of control, so that accuracy of the current of the main circuit collected is reduced when each MOS transistor operates in a state without current equalization.

SUMMARY

The embodiments of the present disclosure provide a current sampling method and a current sampling circuit.

According to an aspect of the embodiments of the present disclosure, a current sampling method is provided. The method comprises: obtaining a detected temperature of each semiconductor switch device of a plurality of parallel semiconductor switch devices; determining that the plurality of parallel semiconductor switch devices are in a current equalization state based on the detected temperature of each semiconductor switch device; obtaining an equalized current flowing through a target semiconductor switch device in the current equalization state, the target semiconductor switch device being any one of the plurality of parallel semiconductor switch devices; determining a total current of a main circuit connected to the plurality of parallel semiconductor switch devices according to the equalized current.

In an embodiment, the method further comprises: reducing a gate voltage of each semiconductor switch device if it is determined that the plurality of parallel semiconductor switch devices are not in the current equalization state.

In an embodiment, the determining that the plurality of parallel semiconductor switch devices are in a current equalization state based on the detected temperature of each semiconductor switch device comprises: calculating a difference $\Delta T$ between a highest detected temperature and a lowest detected temperature of a plurality of detected temperatures; determining whether $\Delta T$ is within a preset temperature range, the preset temperature range being determined according to an equalization temperature of each semiconductor switch device measured in advance in the current equalization state; determining that the plurality of parallel semiconductor switch devices are in the current equalization state if $\Delta T$ is within the preset temperature range.

In an embodiment, the preset temperature range is 0 to T0, and T0 is twice the difference between a first equalization temperature and a second equalization temperature of a plurality of equalization temperatures; wherein the first equalization temperature is a highest equalization temperature of the plurality of equalization temperatures, and the second equalization temperature is a lowest equalization temperature of the plurality of equalization temperatures.

In an embodiment, the semiconductor switch device is a metal-oxide semiconductor field-effect transistor or an insulated gate bipolar transistor.

In an embodiment, the determining a total current of a main circuit connected to the plurality of parallel semiconductor switch devices according to the equalized current comprises: taking a product of the equalized current and a total number of the plurality of semiconductor switch devices as the total current.

In an embodiment, if the semiconductor switch device is a MOS chip, a temperature of the semiconductor switch device is a junction temperature of the MOS chip, and a plurality of parallel MOS chips are packaged in a MOS integrated module; wherein the determining a total current of a main circuit connected to the plurality of parallel semiconductor switch devices according to the equalized current comprises: determining a source-drain voltage $V_{DS}$ of a target MOS chip according to an equalized current $I_i$ flowing through the target MOS chip, a junction temperature $T_1$ of the target MOS chip, an obtained temperature $T_c$ of an environment where the integrated module is located, and a thermal resistance R of the integrated module obtained in advance; obtaining an equalized current $I_i$ flowing through each of n other MOS chips other than the target MOS chip based on the $V_{DS}$, R, $T_c$ and the junction temperature $T_j$ of each of the n other MOS chips; taking a sum of the equalized currents of all the MOS chips as the total current; wherein n is a positive integer greater than 1, and i is a positive integer less than or equal to n.

In an embodiment, $V_{DS}$ is expressed by the following expression:

$$V_{DS} = \frac{T_1 - T_c}{R * I_1}.$$

In an embodiment, $I_i$ is expressed by the following expression:

$$I_i = \frac{T_i - T_c}{R * V_{DS}}.$$

According to another aspect of the embodiments of the present disclosure, a current sampling circuit is provided. The circuit comprises: a plurality of first temperature sensors connected to a processing module, each first temperature sensor being configured to collect a detected temperature of a semiconductor switch device of a plurality of parallel semiconductor switch devices which corresponds to the first temperature sensor; the processing module configured to determine that the plurality of parallel semiconductor switch devices are in a current equalization state based on the detected temperature of each semiconductor switch device, and obtain an equalized current flowing through a target semiconductor switch device in the current equalization state, and determine a total current of a main circuit connected to the plurality of parallel semiconductor switch devices according to the equalized current, the target semiconductor switch device being any one of the plurality of parallel semiconductor switch devices; a current detection module configured to detect the equalized current; a power module connected to the processing module and a gate of each semiconductor switch device, and configured to output a drive voltage to the gate of each semiconductor switch device under control of the processing module.

In an embodiment, the power module comprises: a plurality of power units connected to a plurality of input ports of a multiplexer, wherein each of the power units is connected to a different one of the input ports, and output voltages of the power units are different from each other; the multiplexer connected to the processing module, wherein an output port of the multiplexer is connected to the gate of each semiconductor switch device, and on receiving a control signal output from the processing module, the multiplexer is configured to connect a power unit of the plurality of power units which corresponds to the control signal to the gate of each semiconductor switch device.

In an embodiment, the power module further comprises a plurality of voltage followers; the plurality of power units are connected to the plurality of input ports of the multiplexer through the plurality of voltage followers, and the voltage followers connected between each power unit and each input port are different from each other.

In an embodiment, if the semiconductor switch device is a MOS chip and a plurality of parallel MOS chips are packaged in a MOS integrated module, the circuit further comprises: a second temperature sensor configured to collect a temperature of an environment where the integrated module is located.

In an embodiment, the current detection module comprises a resistor shunt provided in a branch where the target semiconductor switch device is located, and both ports of the resistor shunt are connected to the processing module.

BRIEF DESCRIPTION OF THE DRAWINGS

Features, advantages, and technical effects of exemplary embodiments of the present disclosure will be described below with reference to attached drawings.

DETAILED DESCRIPTION

Various aspects of features and exemplary embodiments of the present disclosure will be described in detail below. The present disclosure will be provided in further detail below in conjunction with accompanying drawings and embodiments in order to make objects, technical solutions and advantages of the present disclosure to be more clearly understood. It is to be appreciated that the specific embodiments described herein are to be construed to illustrate the present disclosure but not to limit the present disclosure. It will be apparent to those skilled in the art that the present disclosure may be practiced without some of these specific details. The following description of the embodiments is merely to provide a better understanding of the present disclosure by illustrating examples thereof.

It is to be noted that relational terms such as first, second and the like are used herein only to distinguish an entity or operation from another entity or operation without requiring or implying that there is any such actual relationship or order between these entities or operations. Moreover, the term "comprise", "include" or any other variant thereof is intended to encompass a non-exclusive inclusion, such that a process, method, article or device that includes a series of elements includes not only these elements but also other elements that are not explicitly listed or those elements that are inherent to such a process, method, article or device. In the absence of more restrictions, elements defined by the statement "includes . . . " do not preclude the presence of additional identical elements in the process, method, article or device that includes the elements.

In order to better understand the present disclosure, the current sampling method and the current sampling circuit according to embodiments of the present disclosure will be described in detail below with reference to the accompanying drawings. It should be noted that these embodiments are not intended to limit the scope of the present disclosure.

Figure 1:
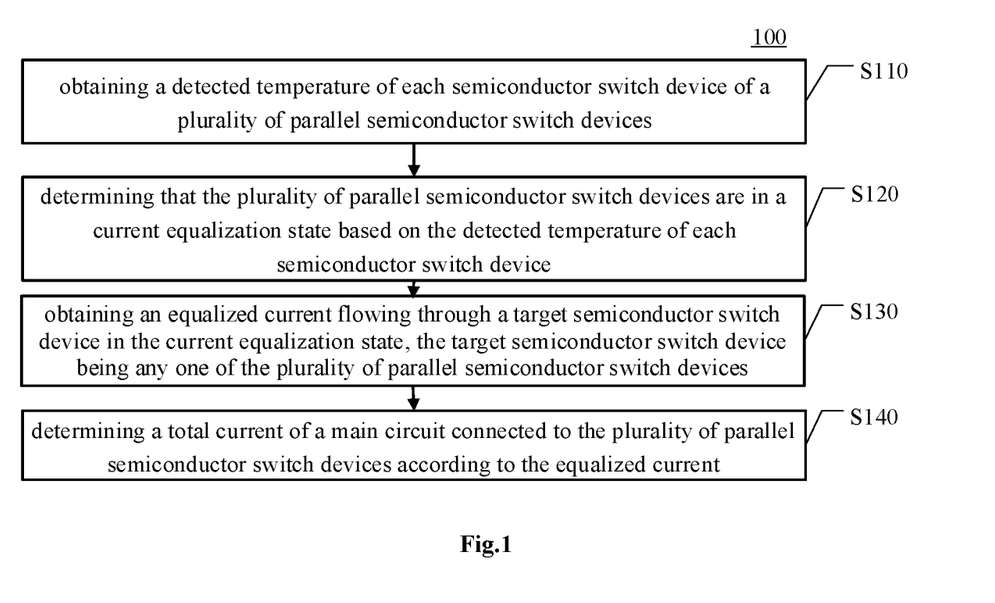
FIG. 1 is a schematic flowchart of a current sampling method according to some embodiments of the present disclosure.

FIG. 1 is a schematic flowchart of a current sampling method 100 according to some embodiments of the present disclosure. The current sampling method provided in the embodiments of the present disclosure includes:

step S110: obtaining a detected temperature of each semiconductor switch device of a plurality of parallel semiconductor switch devices;

step S120: determining that the plurality of parallel semiconductor switch devices are in a current equalization state based on the detected temperature of each semiconductor switch device;

step S130: obtaining an equalized current flowing through a target semiconductor switch device in the current equalization state, the target semiconductor switch device being any one of the plurality of parallel semiconductor switch devices;

step S140: determining a total current of a main circuit connected to the plurality of parallel semiconductor switch devices according to the equalized current.

In the embodiments of the present disclosure, it is first determined whether the plurality of parallel semiconductor switch devices are in the current equalization state based on the temperature of each semiconductor switch device, and the total current of the main circuit is obtained by using the current flowing through any semiconductor switch device collected in the current equalization state, which ensures accuracy of the collected current, and avoids collecting the current of the main circuit in the current equalization state to cause the collected current to be inaccurate.

Figure 2:
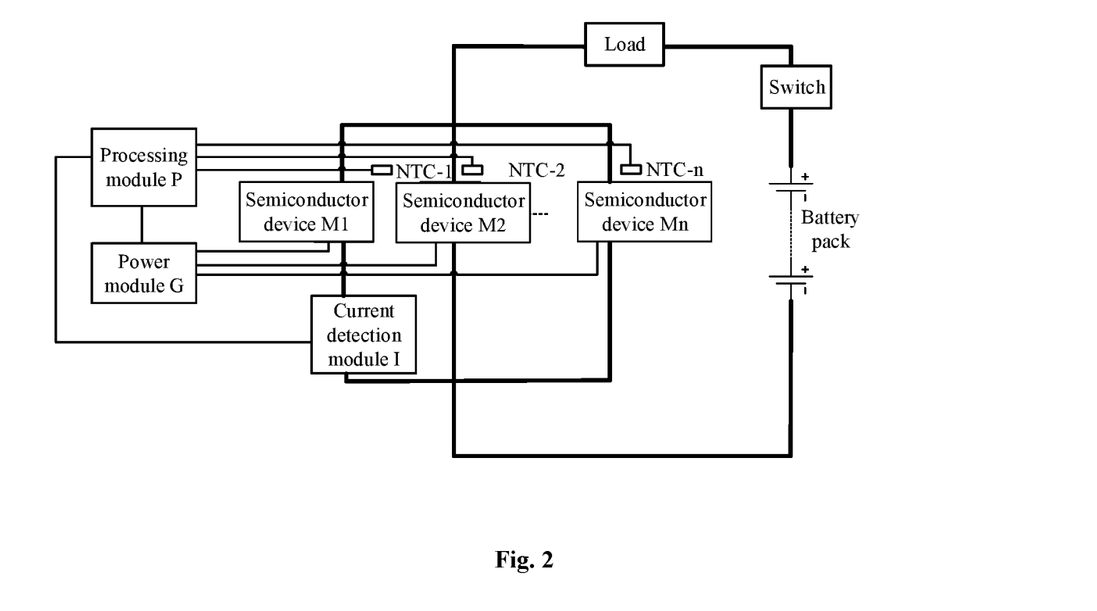
FIG. 2 is a schematic structural diagram of a current sampling circuit according to some embodiments of the present disclosure.

Accordingly, FIG. 2 shows a schematic structural diagram of a current sampling circuit according to the embodiments of the present disclosure. As shown in FIG. 2, the current sampling circuit provided in the embodiments of the present disclosure includes a plurality of first temperature sensors NTC_1, NTC_2 . . . NTC_n, a processing module P, a current detection module I and a power module G.

The plurality of first temperature sensors NTC_1, NTC_2 . . . NTC_n connected to the processing module P. Each first temperature sensor is configured to collect a detected temperature of a semiconductor switch device of a plurality of parallel semiconductor switch devices which corresponds to the first temperature sensor.

The processing module P is configured to determine that the plurality of parallel semiconductor switch devices are in a current equalization state based on the detected temperature of each semiconductor switch device, obtain an equalized current flowing through a target semiconductor switch device in the current equalization state, and determine a total current of the main circuit connected to the plurality of parallel semiconductor switch devices according to the equalized current. The target semiconductor switch device is any one of the plurality of parallel semiconductor switch devices.

The current detection module I is configured to detect the equalized current.

The power module G is connected to the processing module P and a gate of each semiconductor switch device, and is configured to output a drive voltage to the gate of each semiconductor switch device under control of the processing module P.

As shown in FIG. 2, the sampling circuit further includes a plurality of parallel semiconductor switch devices M1, M2, . . . Mn. The plurality of parallel semiconductor switch devices are located in a main circuit of a battery pack, and serve as switch protection devices for the main circuit of the battery pack. The main circuit includes not only the battery pack, but also loads and switches. The loads in the main circuit are electric appliances, such as air-conditioning heating equipment and motors. When the main circuit is turned on, the battery pack is configured to power various loads in the main circuit.

In this example, the target semiconductor switch device is the semiconductor switch device M1. The current detection module I is configured to detect the current flowing through the semiconductor switch device M1.

The power module G is used to output the drive voltage to the gate of each semiconductor switch device, so as to drive each semiconductor switch device to operate.

The plurality of first temperature sensors are respectively provided at specific locations near each semiconductor switch device to detect the temperature of the corresponding semiconductor switch device.

In some examples, one first temperature sensor may be provided near each semiconductor switch device. That is, one of the first temperature sensors measures the temperature of one of the semiconductor switch devices, and the first temperature sensors and the semiconductor switch devices are in one-to-one correspondence.

In other examples, one first temperature sensor may also simultaneously measure the temperatures of the plurality of semiconductor switch devices, that is, the temperatures measured by the first temperature sensor are the temperatures of the plurality of semiconductor switch devices. That is, the first temperature sensor and the semiconductor switch device are not one-to-one correspondence, but each semiconductor switch device has a corresponding temperature sensor.

The current detection module I is provided in any branch of the parallel semiconductor switch devices and collects the current of the branch. And the processing module P obtains a temperature of environment in which the semiconductor switch device operates.

In the current sampling circuit provided in the embodiments of the present disclosure, the processing module P determines whether the plurality of parallel semiconductor switch devices are in the current equalization state based on the temperature of each semiconductor switch device. When the plurality of parallel semiconductor switch devices are in the current equalization state, the total current of the main circuit may be obtained by collecting the current of any semiconductor switch device detected by the current detection module I, thereby monitoring the operating state of the battery pack. By collecting the total current in the current equalization state, the accuracy of the collected current is ensured.

The current sampling method provided in the embodiments of the present disclosure will be described in detail below with reference to a specific example of the current sampling circuit.

Figure 3:
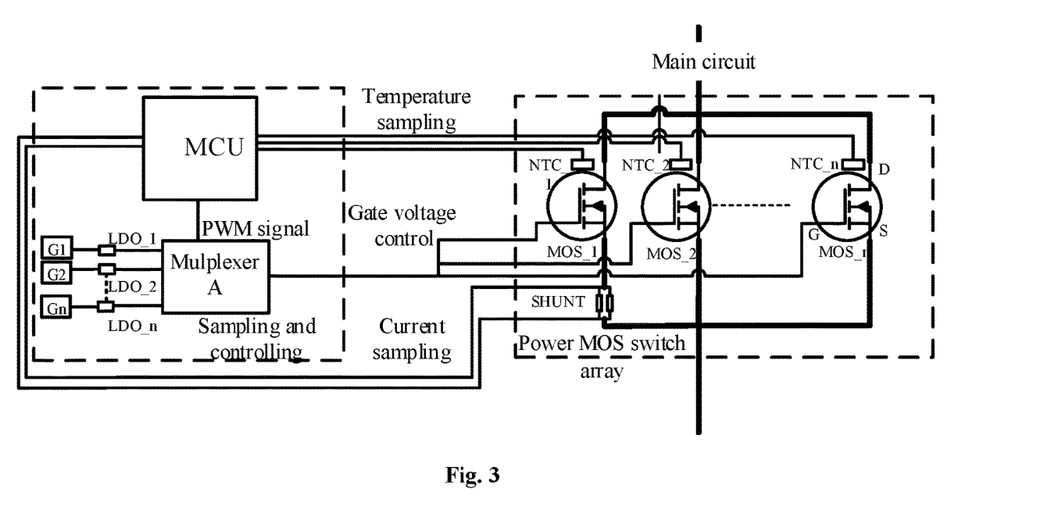
FIG. 3 is a schematic structural diagram of a current sampling circuit according to other embodiments of the present disclosure.

As shown in FIG. 3, the semiconductor switch devices are metal-oxide semiconductor field-effect transistor (MOS). The plurality of parallel MOS transistors MOS_1, MOS_2, . . . , MOS_n shown in FIG. 3 together constitute a switch array of power MOS transistors. The processing module P is a microcontroller unit (Microcontroller Unit, MCU). Each first temperature sensor is configured to detect the temperature of the corresponding MOS transistor. The MCU is configured to sample the temperature output by each first temperature sensor to obtain the temperature of each MOS transistor.

It is worth mentioning that, in some examples, the semiconductor switch devices may also be insulated gate bipolar transistors.

In this example, the power module G includes a plurality of power units G1, G2, . . . , Gn. The plurality of power units are connected to a plurality of input ports of a multiplexer. Each of the power units is connected to a different one of the input ports, and output voltages of the power units are different from each other.

The multiplexer A is connected to the MCU. An output port of the multiplexer A is connected to a gate of each MOS transistor. On receiving a control signal output from the MCU, the multiplexer A is configured to connect a power unit of the plurality of power units which corresponds to the control signal to the gate of each MOS transistor.

It should be noted that the power module G is configured to output a number of different voltages. The plurality of power units G1, G2 . . . Gn in FIG. 3 may also be replaced with an adjustable power source capable of outputting a number of voltages.

The MCU outputs different control signals through different control pins, so that the multiplexer selects the power unit corresponding to the received control signal according to the received control signal and connects it to the gate of each MOS transistor.

The plurality of input ports and output ports of the multiplexer A constitue a plurality of voltage input channels. Because each voltage input channel is connected to a different power unit, and different power units have different output voltages, each voltage input channel in the multiplexer A has a distinct input voltage. When the MCU outputs a control signal to the multiplexer A through the control pin, the multiplexer A selects the voltage input channel corresponding to the control signal, and outputs a voltage corresponding to the voltage input channel through the voltage input channel to a gate of each MOS transistor.

As an example, the multiplexer A includes a first voltage input channel and a second voltage input channel. The MCU may switch between the first voltage input channel and the second voltage input channel by outputting a high level or a low level (i.e., 1 or 0) through the control pin. By analogy, the MCU may control the multiplexer A to switch between the plurality of voltage input channels through a plurality of control pins.

In addition, the MCU may also output a pulse width modulation (PWM) signal to the multiplexer, and the multiplexer outputs periodically oscillated voltage with a frequency and a duty cycle of the received PWM signal.

Therefore, a gate voltage of each MOS transistor may be controlled by using the plurality of power units connected to the multiplexer A. In other words, the MCU realizes temperature sampling and current sampling, and the multiplexer realizes control of the gate voltage.

In some examples, in order to ensure stability of the voltage output by the power module, the power module G further includes a plurality of voltage followers LDO_1, LDO_2, . . . LDO_n. The plurality of power units are connected to the plurality of input ports of the multiplexer A through the plurality of voltage followers, and the voltage followers connected between each power unit and input terminals of each multiplexer A are different from each other.

The current detection module I includes a resistor shunt. The resistor shunt includes two parallel resistors. The resistor shunt is provided in a branch where MOS_1 is located, and both ends of the resistor shunt are connected to the MCU. The MCU may calculate a current flowing through the resistor shunt, that is, the current flowing through MOS_1, according to a voltage collected at both ends of the resistor shunt and a resistance value of the resistor shunt obtained in advance.

The MCU may collect the current through MOS_1 by connecting with the resistor shunt. The main circuit in FIG. 3 is the same as the main circuit in FIG. 2, which is not shown in FIG. 3.

The parallel MOS transistors in FIG. 3 are directly soldered to a heat-dissipating metal substrate, as a junction temperature of the MOS transistors may not be obtained in this case. Therefore, the method for a current equalization detection and a total current collection of the main circuit which is carried out by using the current sampling circuit in FIG. 3 are as follows.

First, in the current equalization state, an equalization temperature of each MOS transistor is measured in advance. As an example, a current of the circuit where each MOS transistor is located may be measured to determine whether the plurality of parallel MOS transistors are in the current equalization state. If the plurality of parallel MOS transistors are in the current equalization state, the equalization temperature of each MOS transistor in the current equalization state is measured. Then, a preset temperature range is determined according to a plurality of equalization temperatures measured in advance.

As a specific example, the preset temperature range is from 0 to T, T is twice the difference $\Delta T_0$ between a first equalization temperature and a second equalization temperature of the plurality of equalization temperatures. The first equalization temperature is greater than any temperatures other than the first equalization temperature of the plurality of equalization temperatures, and the second equalization temperature is lower than any temperatures other than the second equalization temperature of the plurality of equalization temperatures.

That is to say, the first equalization temperature is the highest equalization temperature of the plurality of equalization temperatures, and the second equalization temperature is the lowest equalization temperature of the plurality of equalization temperatures. T is twice the difference $\Delta T_0$ between the highest equalization temperature and the lowest equalization temperature from the plurality of parallel MOS transistors, that is, $T=2\Delta T_0$.

Figure 4:
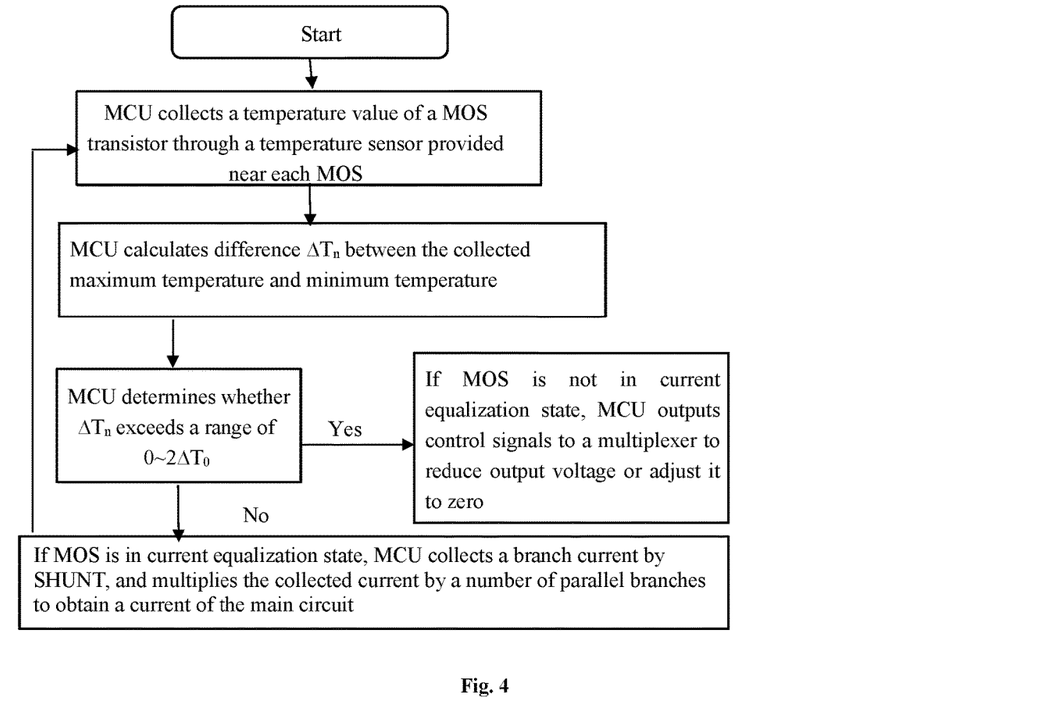
FIG. 4 is a schematic flowchart of a current sampling method according to other embodiments of the present disclosure.

Referring to FIG. 4, in the same environment, the MCU collects the detected temperature of the corresponding MOS transistor at the same time through a temperature sensor provided at a specific position near each MOS transistor. Then, a difference $\Delta T_n$ between the first detected temperature and the second detected temperature of the plurality of detected temperatures is calculated; the first detected temperature is greater than any temperatures other than the first detected temperature of the plurality of detected temperatures, and the second detected temperature is lower than any temperatures other than the second detected temperature of the plurality of detected temperatures. That is to say, the first detected temperature is the highest detected temperature of the plurality of detected temperatures collected by the MCU, and the second detected temperature is the lowest detected temperature of the plurality of detected temperatures collected by the MCU. That is, the MCU calculates the difference $\Delta T_n$ between the highest detected temperature and the lowest detected temperature.

Then, the MCU determines whether $\Delta T_n$ is within the preset temperature range. As an example, the preset temperature range may be the range of $0 \sim \Delta T_0$, $0 \sim 2\Delta T_0$ or $0 \sim T'$, and T' is any temperature within the range of $\Delta T_0 \sim 2\Delta T_0$.

If $\Delta T_n$ is within the range of $0 \sim 2\Delta T_0$, it is determined that the plurality of parallel semiconductor switch devices are in the current equalization state, and the output voltage of the multiplexer A remains unchanged. The MCU collects an equalized current of the branch where MOS_1 is located through a resistor shunt provided in a parallel branch. A product of the collected equalized current and a total number of the plurality of semiconductor switch devices is taken as a total current of the main circuit. In other words, the current of the main circuit is obtained by multiplying the collected equalized current by a number of parallel branches, and the main circuit operates normally.

When the MCU determines that $\Delta T_n$ exceeds the range of $0\sim 2\Delta T_0$, it is determined that the plurality of parallel MOS transistors are not in the current equalization state. At this time, the MCU outputs control signals to the multiplexer A. The multiplexer A reduces the output voltage or adjusts the output voltage to zero to protect devices in the main circuit. By cycling the above process, the current equalization state of the MOS transistor may be continuously detected, and the current of the main circuit may be continuously collected.

In the embodiments of the present disclosure, it is determined whether the parallel MOS transistors are in the current equalization state by determining whether temperature fluctuation of each MOS transistor is consistent. In the same conditions, the MCU determines whether the temperature fluctuation of the MOS transistor is inconsistent with that of other MOS transistors. If the temperature fluctuation of the MOS transistor is inconsistent with that of other MOS transistors, it is considered that there is an equalized current in the MOS transistor. The MCU outputs control signals to the multiplexer to reduce the output voltage or reduce it to zero. If the MCU determines that the temperature fluctuations of all the MOS transistors are the same, it is considered that the plurality of parallel MOS transistors are operating in the current equalization state, the output voltage of the multiplexer remains unchanged, and the current of a certain branch is collected through the resistor shunt, and the collected current is multiplied by a number of parallel branches to get the total current of the main circuit.

The current detection module does not detect the current of each single MOS transistor switch channel in the MOS switch array. In this case, equalization for current of each MOS transistor is out of control, which may cause a large amount of heat in some MOS transistors, and even cause the situation that the temperature is out of control and thus the MOS transistor is burn out. The current sampling method and the circuit sampling circuit provided in the embodiments of the present disclosure may accurately monitor whether the current non-equalization occurs in the parallel MOS transistors in the main circuit, which avoids the possible temperature out-of-control and even burnout in some MOS transistors. At the same time, accurate current acquisition is also achieved.

In the embodiments of the present disclosure, the system cost may be effectively reduced by using the low-cost temperature sensor and the resistor shunt to determine the current equalization state of the MOS transistors and collect the current.

The current sampling method provided in the embodiments of the present disclosure is described in detail below with reference to another specific example of the current sampling circuit.

Figure 5:
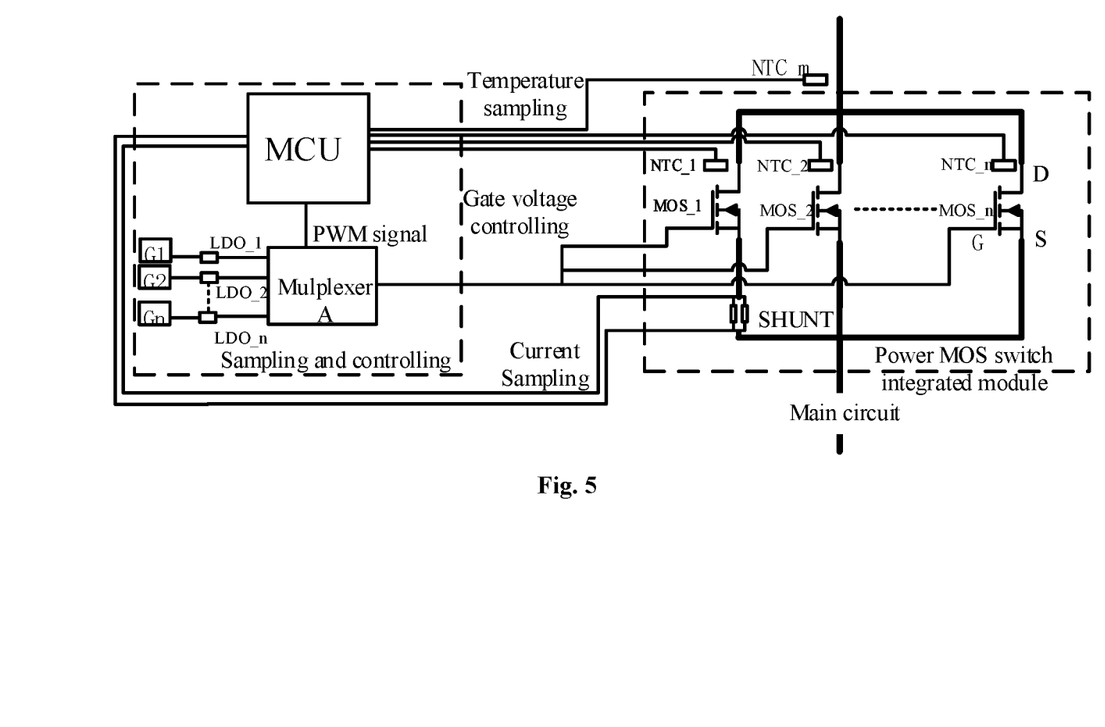
FIG. 5 is a schematic structural diagram of a current sampling circuit according to still other embodiments of the present disclosure.

FIG. 5 illustrates a current sampling circuit according to another specific embodiment of the present disclosure. A semiconductor switch device in FIG. 5 is a MOS chip, and a plurality of parallel MOS chips are packaged in a MOS integrated module. The difference from FIG. 3 is that the current sampling circuit in FIG. 5 further includes a second temperature sensor NTC-m. The second temperature sensor NTC-m is configured to collect the temperature of the environment where the integrated module is located.

The plurality of parallel MOS chips are directly packaged in an integrated module, and a temperature sensor is integrated at a specific position near each MOS chip in the integrated module to detect the junction temperature of each parallel MOS chip. A temperature sensor is placed at a specific location outside the integrated module to detect the temperature of the environment in which the integrated module is located. The method for current equalization detection and total current collection of the main circuit by using the current sampling circuit in FIG. 5 is as follows.

First, the difference $\Delta T_0'$ between the highest junction temperature and the lowest junction temperature of the parallel MOS chip is calculated when the MOS chip of the integrated module operates in the current equalization state. At the same time, the MCU obtains the junction temperature $T_1$, $T_2$, $T_3$ of the corresponding MOS chip by a temperature sensor near each parallel MOS chip in the integrated module. The environment temperature $T_c$ outside the module is obtained by a temperature sensor outside the integrated module. The equalized current $I_1$ of the branch is obtained by the resistor shunt in the branch where the MOS_1 chip is located.

Then, the MCU calculates the difference $\Delta T_n'$ between the maximum temperature and minimum temperature of the collected chip junction temperatures. When the MCU determines that $\Delta T_n'$ exceeds the range of $0\sim 2\Delta T_0'$, it is considered that the parallel MOS transistor is not operating in the current equalization state. At this time, the MCU outputs control signals to the multiplexer which reduces the output voltage or adjusts it to zero to protect the devices in the main circuit.

When the MCU determines that $\Delta T_n'$ is within the range of $0\sim 2\Delta T_0'$, it is considered that the parallel MOS chip is in the current equalization state, and the output voltage of the multiplexer remains unchanged.

Then, a source-drain voltage $V_{DS}$ of the MOS_1 chip is determined according to the equalized current $I_1$ flowing through the MOS_1 chip, a junction temperature $T_1$, $T_c$ of the MOS_1 chip, and a thermal resistance R (a constant) of the integrated module obtained in advance.

Specifically, both the temperature $T_c$ and the thermal resistance R of the integrated module are known, a dissipated power $P_{dissipated}$ of each MOS chip may be calculated. $P_{dissipated}$ may be calculated using the following expression:

$$P_{dissipated}=(T_i-T_c)/R \tag{1}$$

where $T_i$ is the collected junction temperature of the corresponding MOS chip, i is a positive integer less than or equal to n, and n is the number of MOS chips in FIG. 5. As an example, $T_1$ is the junction temperature of the MOS_1 chip, $T_2$ is the junction temperature of the MOS_2 chip . . . This the junction temperature of the MOS_n chip.

The operating voltage $V_{DS}$ (i.e., the source-drain voltage) of the parallel MOS chip may be obtained based on the current $I_i$ of the branch where the MOS_1 chip is located, the junction temperature $T_1$ of the MOS_1 chip, and the temperature $T_c$ of the integrated module:

$$V_{DS}=\frac{T_1-T_c}{R*I_1} \tag{2}$$

Therein the dissipated power $P_{dissipated}$ of each MOS chip may also be calculated using the following expression:

$$P_{dissipated}=I_i*V_{DS} \tag{3}$$

where $I_i$ is the source-drain current flowing through the corresponding MOS chip.

The dissipated power of each MOS chip may be obtained by expression (1). It may be known from expression (3) that the dissipated power of the MOS chip $P_{dissipated}$ is determined by the source-drain voltage and source-drain current. Because the MOS chip has a parallel structure, the source-drain voltage of all the MOSs are the same. The MCU obtains the source-drain current $I_i$ of the MOS_1 branch by the resistor shunt of the MOS_1 branch. The source-drain voltage of the parallel MOS transistor may be calculated by expression (2) Voltage.

By combining expressions (1), (2) and (3), the source-drain current $I_i$ of each MOS chip except MOS_1 may be accurately calculated, and L may be expressed by the following expression:

$$I_i = \frac{T_i - T_c}{R * V_{DS}} \quad (4)$$

Finally, the accurate total current of the main circuit may be obtained by adding the obtained source-drain current of all the MOS chips. By circulating the above process, the current equalization state of the MOS transistor may be continuously detected, and the total current of the main circuit may be continuously collected.

In the embodiments of the present disclosure, by monitoring the difference between the maximum temperature and the minimum temperature of the plurality of parallel MOS transistors or the plurality of parallel MOS chips, the basis for determining whether the MOS transistor or the MOS chip operates in a current equalization state is as follows.

Referring to expressions (1) and (3), the temperature of the MOS transistor or the MOS chip is determined by its dissipated power, which is determined by the source-drain current and the source-drain voltage of the MOS. When the MOS transistor or the MOS chip are connected in parallel, the source-drain voltages of all the MOS transistors or the MOS chips are the same. Therefore, when the parallel MOS transistors are in a current equalization state, that is, when the source-drain current flowing through each MOS is the same, the dissipated power is the same, and there is no significant difference between the maximum temperature and the minimum temperature of the plurality of parallel MOS transistors or the plurality of parallel MOS chips.

When the plurality of parallel MOS transistors or the plurality of parallel MOS chips are in current non-equalization state, that is, the source-drain current flowing through each MOS transistor or each MOS chip is no longer the same, and the dissipated power of the MOS transistors or the MOS chip changes significantly, which causes temperature change of the corresponding MOS transistor or MOS chip. At this time, there will be a significant difference between the maximum temperature and the minimum temperature of the plurality of temperatures of the plurality of parallel MOS transistors or the plurality of parallel MOS chips.

The current sampling circuit and the circuit sampling method provided in the embodiments of the present disclosure may determine whether the plurality of parallel semiconductor switch devices are in the current equalization state, and realize accurate current collection in the current equalization state.

It should also be noted that the exemplary embodiments in the present disclosure describe some methods or systems based on a series of steps or an apparatus. However, the present disclosure is not limited to the order of the above steps.

The above description is only for illustrating the specific embodiments of the present disclosure. It will be apparent to those skilled in the art that, for the sake of convenience and simplicity of description, specific operating processes of the systems, units and elements described above may be known by referring to corresponding processes in the foregoing method embodiments, and will not be repeated herein. It is to be understood that the scope of the present disclosure is not limited thereto. Within the technical scope of the present disclosure, various modifications or substitutions may be readily apparent to those skilled in the art, and all of the modifications or substitutions are to be included within the scope of the present disclosure.

The invention claimed is:

1. A current sampling method, comprising:
   obtaining a detected temperature of each semiconductor switch device of a plurality of parallel semiconductor switch devices;
   determining that the plurality of parallel semiconductor switch devices are in a current equalization state, based on the detected temperature of each semiconductor switch device;
   obtaining an equalized current flowing through a target semiconductor switch device in the current equalization state, wherein the target semiconductor switch device is any one of the plurality of parallel semiconductor switch devices; and
   determining a total current of a main circuit connected to the plurality of parallel semiconductor switch devices according to the equalized current,
   wherein under a condition that each semiconductor switch device is a metal-oxide semiconductor (MOS) chip, a temperature of each semiconductor switch device is a junction temperature of the MOS chip, and a plurality of parallel MOS chips are packaged in a MOS integrated module;
   wherein the determining a total current of a main circuit connected to the plurality of parallel semiconductor switch devices according to the equalized current comprises:
   determining a source-drain voltage $V_{DS}$ of a target MOS chip according to an equalized current $I_1$ flowing through the target MOS chip, a junction temperature $T_1$ of the target MOS chip, an obtained temperature $T_c$ of an environment where the integrated module is located, and a thermal resistance R of the integrated module obtained in advance;
   obtaining an equalized current $I_i$ flowing through each of n other MOS chips other than the target MOS chip, based on the $V_{DS}$, R, $T_c$ and the junction temperature $T_i$ of each of the n other MOS chips;
   taking a sum of the equalized currents of all the MOS chips as the total current;
   wherein n is a positive integer greater than 1, and i is a positive integer less than or equal to n.

2. The method of claim 1, wherein the determining that the plurality of parallel semiconductor switch devices are in a current equalization state based on the detected temperature of each semiconductor switch device comprises:
   calculating a difference $\Delta T$ between a first detected temperature and a second detected temperature of a plurality of detected temperatures, wherein the first detected temperature is greater than any temperatures other than the first detected temperature of the plurality of detected temperatures, and the second detected temperature is lower than any temperatures other than the second detected temperature of the plurality of detected temperatures;

determining whether ΔT is within a preset temperature range, wherein the preset temperature range is determined according to an equalization temperature of each semiconductor switch device measured in advance in the current equalization state;

determining that the plurality of parallel semiconductor switch devices are in the current equalization state if ΔT is within the preset temperature range.

3. The method of claim 2, wherein the preset temperature range is 0 to $T_0$, and $T_0$ is twice the difference between a first equalization temperature and a second equalization temperature of a plurality of equalization temperatures;

wherein the first equalization temperature is greater than any temperatures other than the first equalization temperature of the plurality of equalization temperatures, and the second equalization temperature is lower than any temperatures other than the second equalization temperature of the plurality of equalization temperatures.

4. The method of claim 1, wherein the determining a total current of a main circuit connected to the plurality of parallel semiconductor switch devices according to the equalized current comprises:

taking a product of the equalized current and a total number of the plurality of semiconductor switch devices as the total current.

5. The method of claim 1, wherein $V_{DS}$ is expressed by the following expression:

$$V_{DS} = \frac{T_1 - T_c}{R * I_1}.$$

6. The method of claim 1, wherein $I_i$ is expressed by the following expression:

$$I_i = \frac{T_i - T_c}{R * V_{DS}}.$$

7. A current sampling circuit, comprising:
a plurality of first temperature sensors connected to a processing module, each first temperature sensor being configured to collect a detected temperature of a semiconductor switch device of a plurality of parallel semiconductor switch devices which corresponds to the first temperature sensor;
the processing module configured to determine that the plurality of parallel semiconductor switch devices are in a current equalization state based on the detected temperature of each semiconductor switch device, obtain an equalized current flowing through a target semiconductor switch device in the current equalization state, and determine a total current of a main circuit connected to the plurality of parallel semiconductor switch devices according to the equalized current, the target semiconductor switch device being any one of the plurality of parallel semiconductor switch devices;
a current detection module configured to detect the equalized current;
a power module connected to the processing module and a gate of each semiconductor switch device, and configured to output a drive voltage to the gate of each semiconductor switch device under control of the processing module,
wherein the power module comprises:
a plurality of power units connected to a plurality of input ports of a multiplexer, wherein each of the power units is connected to a different one of the input ports, and output voltages of the power units are different from each other;
the multiplexer connected to the processing module, wherein an output port of the multiplexer is connected to the gate of each semiconductor switch device, and on receiving a control signal output from the processing module, the multiplexer is configured to connect a power unit of the plurality of power units which corresponds to the control signal to the gate of each MOS transistor.

8. The current sampling circuit of claim 7, wherein the power module further comprises a plurality of voltage followers;
the plurality of power units are connected to the plurality of input ports of the multiplexer through the plurality of voltage followers, and the voltage followers connected between each power unit and each input port are different from each other.

9. The current sampling circuit of claim 7, wherein under a condition that each semiconductor switch device is a metal-oxide semiconductor (MOS) chip and a plurality of parallel MOS chips are packaged in a MOS integrated module, the circuit further comprises:
a second temperature sensor configured to collect a temperature of an environment where the integrated module is located.

10. The current sampling circuit of claim 7, wherein the current detection module comprises a resistor shunt provided in a branch where the target semiconductor switch device is located, and both ports of the resistor shunt are connected to the processing module.

11. The method of claim 1, wherein the semiconductor switch device is a metal-oxide semiconductor (MOS) field-effect transistor or an insulated gate bipolar transistor.

12. The method of claim 1, wherein the method further comprises:
reducing a gate voltage of each semiconductor switch device if it is determined that the plurality of parallel semiconductor switch devices are not in the current equalization state.

* * * * *